United States Patent [19]
Gabriel

[11] Patent Number: 6,103,457
[45] Date of Patent: Aug. 15, 2000

[54] METHOD FOR REDUCING FACETING ON A PHOTORESIST LAYER DURING AN ETCH PROCESS

[75] Inventor: Calvin T. Gabriel, Cupertino, Calif.

[73] Assignee: Philips Electronics North America Corp., New York, N.Y.

[21] Appl. No.: 09/086,700

[22] Filed: May 28, 1998

[51] Int. Cl.[7] .................................................. G03F 7/26
[52] U.S. Cl. .......................................... 430/318; 430/313
[58] Field of Search .................................. 430/311, 313, 430/315, 318, 325, 328, 330

[56] References Cited

U.S. PATENT DOCUMENTS

| | | | |
|---|---|---|---|
| 4,187,331 | 2/1980 | Hsioh-Lien Ma | 430/328 |
| 5,192,697 | 3/1993 | Leong | 437/37 |
| 5,302,551 | 4/1994 | Iranmanesh et al. | 437/195 |
| 5,686,356 | 11/1997 | Jain et al. | 437/195 |
| 5,702,870 | 12/1997 | Brugge | 430/314 |
| 5,743,998 | 4/1998 | Park | 156/628.1 |
| 5,757,060 | 5/1998 | Lee et al. | 257/529 |

OTHER PUBLICATIONS

S.J. Holmes, P.H. Mitchell and M.C. Hakey, "Manufacturing with DUV Lithography", IBM Journal of Research & Development, vol. 41, No. ½ Optical lithography, 1997 IBM.

H.Ito, "Chemical amplification resists: History and development within IBM", IBM Journal of Research and Development, vol. 41, No. 1/2 Optical lithography, 1997 IBM.

Extended Abstract of The Electrochemical Society Spring Meeting, Los Angeles, California, May 1996. ECS, Pennington, New Jersey.

Abstract, "Application of Surface Reformed Thick Spin–on– Glass to MOS Device Planarization", Soc., vol. 137, No. 4, Apr. 1990©, The Electrochemical Society.

*Primary Examiner*—Kathleen Duda
*Attorney, Agent, or Firm*—Martine Penilla & Kim, LLP

[57] ABSTRACT

Disclosed is a method for reducing faceting of a photoresist layer during an etch process. The method includes depositing a metallization layer on a semiconductor substrate, and forming a photoresist layer over at least a portion of the metallization layer. The method also includes treating the photoresist layer with a first plasma so as to harden the photoresist layer against a metal etching plasma. The method further includes exposing the metallization layer and the photoresist layer to the metal etching plasma. The metal etching plasma etches the metallization layer at a substantially faster rate than the treated photoresist layer so that faceting on the photoresist layer is substantially reduced.

42 Claims, 7 Drawing Sheets

METHOD FOR REDUCING FACETING ON A PHOTORESIST LAYER DURING AN ETCH PROCESS

BACKGROUND OF THE INVENTION

1. Field of the Invention

This invention relates generally to the manufacture of semiconductor devices, and more particularly to a method for improving the resistance of photoresist against metal etch plasma.

2. Description of the Related Art

Since the introduction of semiconductor devices, the size of semiconductor devices have been continuously shrinking, resulting in smaller semiconductor chip size and increased device density on the chip. In fabricating smaller semiconductor devices, etch process is an important semiconductor process since it defines line-widths and other micro features on integrated circuits. For example, a metal etch process is widely used to etch metal layers, such as aluminum and aluminum alloy layers, that are used to form interconnect lines and contacts.

With the continuing need to increase in integrated circuit density, one of the main problems in etching metal films is the decreasing size of a photoresist mask. Specifically, fabricating a higher resolution integrated circuit chip requires a higher resolution photomask with thinner photoresist layers. For example, the thickness of a photoresist layer, for approximately 1 micron technology devices, may be between 2 to 3 microns. In contrast, for 0.2 micron technology devices, the thickness of the photoresist may be reduced to about 0.6 micron. Since metal thickness is largely dependent on electrical resistance and electromigration requirements, the metal thickness typically does not scale with the photoresist thickness.

The use of thinner photoresist layers presents several problems in the metal etching process. For example, photoresist layers are often prematurely consumed during plasma etching of metal films. As is well known, dry etching processes such as sputter etching, reactive-ion etching, and plasma etching, are widely used in etching metals. This is because dry etching increases interconnect capabilities by providing highly anisotropic etching profiles.

On the other hand, dry etching processes also typically produce undesirable facets on the surfaces of a photoresist layer of Prior Art FIG. 1, which illustrates a cross section of a silicon wafer stack 100 after being exposed to bombarding etchant ions in a metal etching process. The wafer stack 100 includes a substrate 102, an oxide (e.g., IMO) layer 104, a metallization layer 106, and a photoresist layer 108. The oxide layer 104 is deposited on the substrate 102. The metallization layer 106 is formed over the oxide layer 104 and includes aluminum or aluminum alloys. The patterned and etched photoresist layer 108 includes photoresist portions 118, 120, 122, and 124 formed on metallization layer portions 110, 112, 113, and 116, respectively, of the metallization layer 106.

In this wafer stack configuration, etchant ions designed to etch metals (e.g., $Cl_2$, $BCl_3$, etc.) have also bombarded and etched the exposed surfaces of the photoresist layer to form a plurality of facets 126, 128, 130, 132, 134, 134, 138, and 140 on the photoresist portions 118, 120, 122, and 124. The facets 126, 128, 130, 132, 134, 134, 138, and 140 typically result from bombardment of etchant ions. More specifically, in dry etching processes, etchant ions are used to bombard the surface of a metallization layer in order to remove the metallization layer from those regions not covered by photoresist. These etchant ions generally have sufficient energy to sputter the relatively soft photoresist material. Sputtering erodes the photoresist and creates a facet at an angle of approximately 45 degrees to the incoming ions because sputter yield is maximum at this angle.

With continuing reference to Prior Art FIG. 1, the faceting of the photoresist layer portions 118, 120, 122, and 124 may subsequently lead to the complete removal of the photoresist layer 108 and also result in removal of portions of the metallization layer 106. When this happens, unwanted open or short circuits may be produced. In particular, when the facet etches down and breaks through to the underlying metallization layer, a phenomenon commonly known as "etch mask failure" occurs and the etch mask will no longer function as intended. For example, the faceted features of the photoresist layer portions 120 and 124 expose the sides 142, 144, 146, and 148 of the metallization layer portions 112 and 116. These cases demonstrate etch mask failures, which refer to the exposure of the metal portions 110, 112, 114, and 116 under the photoresist layer 106. When an etch mask failure occurs, the exposed metal portions 110, 112, 114, and 116 will unfortunately be etched away. Etch mask failures are undesirable because they may cause circuit failures and adversely affect subsequent semiconductor processes that are carried out for subsequent layers that may be fabricated above the metallization layer.

In view of the foregoing, what is needed is a method for reducing the faceting effect of photoresist layers during subsequent metal etch processes.

SUMMARY OF THE INVENTION

Broadly speaking, the present invention fills these needs by providing a method for reducing faceting of a photoresist layer during an etch process. It should be appreciated that the present invention can be implemented in numerous ways, including as a process, an apparatus, a system, a device, or a method. Several inventive embodiments of the present invention are described below.

In one embodiment, the present invention provides a method for reducing faceting of a photoresist layer during an etch process. The method includes depositing a metallization layer on a semiconductor substrate, and forming a photoresist layer over at least a portion of the metallization layer. The method also includes treating the photoresist layer with a first plasma so as to harden the photoresist layer against a metal etching plasma. The method further includes exposing the metallization layer and the photoresist layer to the metal etching plasma. The metal etching plasma etches the metallization layer at a substantially faster rate than the treated photoresist layer so that faceting on the photoresist layer is substantially reduced.

In another embodiment, the present invention provides a method for reducing faceting of a photoresist layer during an etch process. The method includes depositing a first layer on a semiconductor substrate and forming a photoresist layer over at least a portion of the first layer. The method also includes treating the photoresist layer with a first plasma so as to harden the photoresist layer against an etching plasma that is adapted to etch the first layer. The method further includes exposing the first layer and the photoresist layer to the first etching plasma, the first etching plasma etching the first layer at a substantially faster rate than the treated photoresist layer, whereby faceting on the photoresist layer is substantially reduced.

In yet another embodiment, a method for reducing faceting of a photoresist layer during a metal etch process is disclosed. The method includes: (a) depositing a metallization layer on a semiconductor substrate; (b) forming a photoresist layer over at least a portion of the metallization layer; (c) treating the photoresist layer with a fluorocarbon plasma so as to harden the photoresist layer against a metal etching plasma; and (d) exposing the metallization layer and the photoresist layer to the metal etching plasma, the metal etching plasma etching the metallization layer at a substantially faster rate than the treated photoresist layer, whereby faceting on the photoresist layer is substantially reduced.

Advantageously, the present invention increases the resistance of a photoresist layer against metal etch plasma. The increased etch resistance of the photoresist layer substantially withstands bombarding plasma ions designed to etch a metallization layer. Accordingly, the formation of facets on the patterned photoresist layer is significantly reduced. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

Prior Art

DETAILED DESCRIPTION OF THE PREFERRED EMBODIMENTS

An invention is described for a method for reducing faceting of a photoresist layer during an etch process. It will be obvious, however, to one skilled in the art, that the present invention may be practiced without some or all of these specific details. In other instances, well known process operations have not been described in detail in order not to unnecessarily obscure the present invention.

Figure 2A:
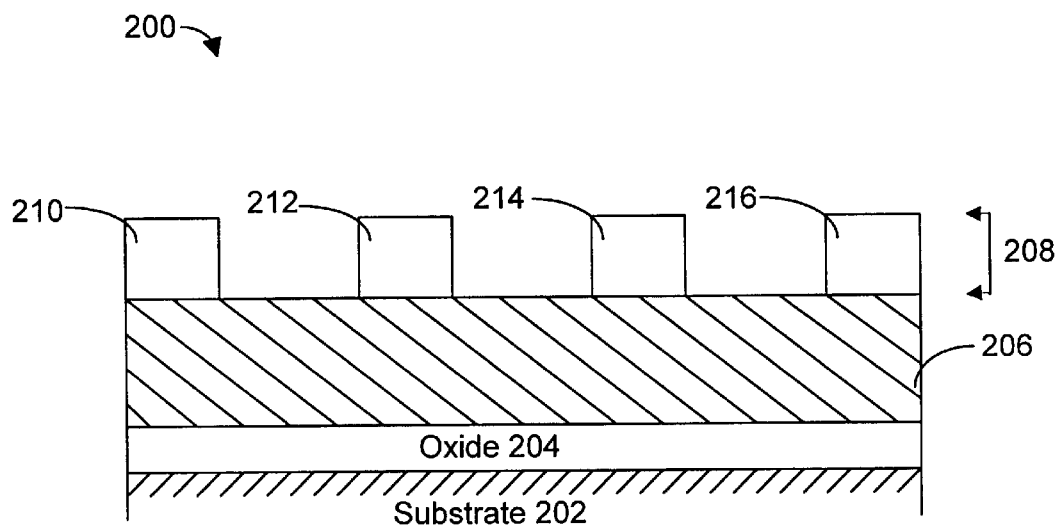
FIG. 2A illustrates a cross section of a silicon wafer stack including a plurality of photoresist layer portions formed on top of a metallization layer in accordance with one embodiment of the present invention.

FIG. 2A illustrates a cross sectional view of a silicon wafer stack 200 including a photoresist layer 208 formed as a photomask over a metallization layer 206 in accordance with one embodiment of the present invention. The silicon wafer stack 200 includes a substrate 202 and an oxide (e.g., $SiO_2$) layer 204 formed over the substrate 202. The oxide layer 204 may be an inter-metal oxide layer.

The metallization layer 206 is formed over the oxide layer 204. In accordance with one embodiment of the present invention, the metallization layer 206 comprises aluminum, copper, or any of the known aluminum alloys such as Al—Cu, Al—Si, or Al—Cu—Si. The photoresist layer 208 is shown as a photomask over portions of the metallization layer 206 and includes the photoresist layer portions 210, 212, 214, and 216. The photoresist layer 208 is made of a photoresist material, which may be spin-coated, and patterned to form a photomask through exposure and development. Once developed, the photomask will serve to define the etching locations over the metallization layer 206.

With reference to FIG. 2A, it should be appreciated that other additional layers above, below, or between the layers shown may be present in the wafer stack 200. For example, a barrier layer, typically formed of Ti, TiW, TiN or other suitable barrier materials, may be disposed between the oxide layer 204 and the subsequently deposited metallization layer 206. The barrier layer, when provided, functions to prevent the diffusion of silicon atoms from oxide layer 204 into the metallization layer 206. In addition, not all the layers shown need be present and some or all may be substituted by other different layers.

Figure 2B:
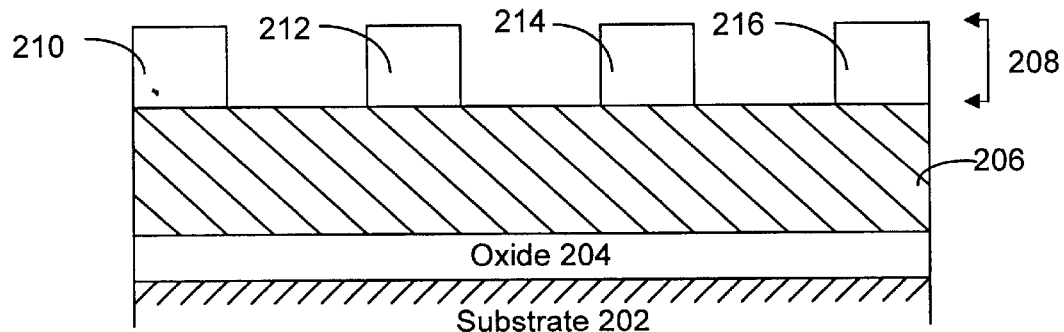
FIG. 2B illustrates the cross sectional view of the silicon wafer stack depicting the photoresist layer being treated for reducing photoresist faceting.

FIG. 2B illustrates the cross sectional view of the silicon wafer stack 200 depicting the photoresist layer 208 being treated for reducing photoresist faceting during a subsequent metal etch process. For treatment, the surface of the photoresist layer 208 is exposed to a fluorocarbon plasma such as $CF_4$, $CHF_3$, $C_2F_6$, and the like. In one embodiment, the wafer stack 200 including the photoresist layer 208 and the metallization layer 206 is exposed to the fluorocarbon plasma in a plasma etch or chemical vapor deposition (CVD) process. For example, the photoresist layer 208 may be exposed to the flurocarbon plasma in a plasma etcher. Although any suitable plasma etcher may be employed, one exemplary plasma etcher is a Lam Research 4520™ plasma etching apparatus, which is available from Lam Research of Fremont, Calif.

The exposure of the photoresist layer 208 to the fluorocarbon plasma increases the resistance of the photoresist layer 208 to metal etchants such as $BCl_3$, $Cl_2$, $CCl_4$, HCl, $SiCl_4$, and the like. That is, the fluorocarbon plasma exposure reduces the sensitivity of the photoresist layer 208 surface to the metal etchants by hardening the photoresist layer 208. In the preferred embodiment, the fluorocarbon plasma may include any fluorocarbon and fluorocarbon-based combinations such as $CF_4$, $CHF_3$, $C_2F_6$, and the like. In addition or as an alternative to the flurorocarbon plasma, the treatment may also expose the photoresist layer 208 to fluorine-based plasma such as $SF_6$ plasma or carbon-based plasma.

Figure 2C:
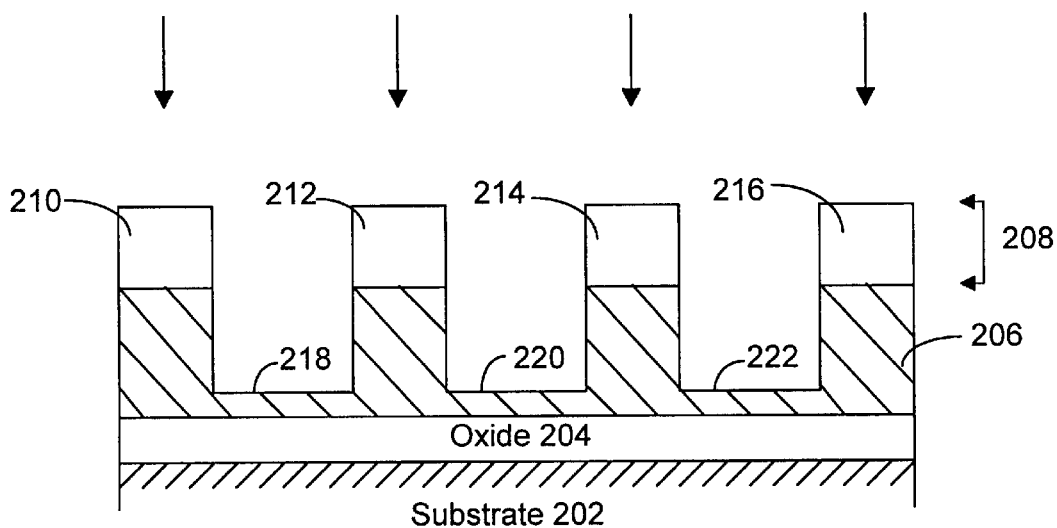
FIG. 2C illustrates the cross section of the silicon wafer stack being exposed to bombarding etchant ions.

FIG. 2C illustrates the cross section of the silicon wafer stack 200 being exposed to bombarding etchant plasma for etching the metallization layer 206. In this plasma etching process, the metallization layer 206 along with the photoresist layer 208 is exposed to the etchant plasma. The etch process proceeds until the exposed portions 218, 220, and 222 have been substantially etched to expose the oxide layer 204 underneath. During the etch process, the previously treated photoresist layer portions 210, 212, 214, and 216 are substantially protected from the metal etchant plasma. That is, the treatment provides resistance to the photoresist layer portions 210, 212, 214, and 216 from the bombarding ions of the etchant plasma.

Figure 1:
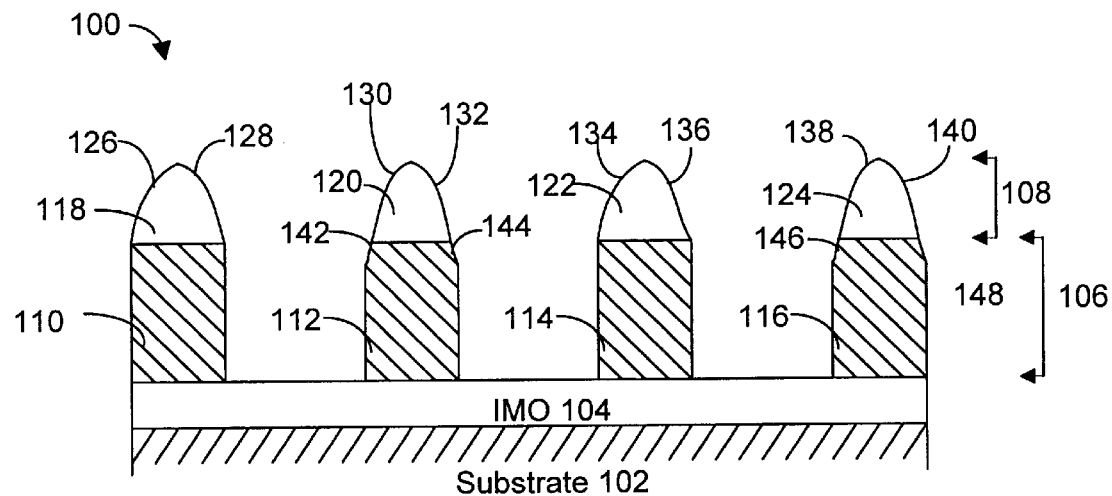
FIG. 1 illustrates a cross section of a silicon wafer stack after being exposed to bombarding etchant ions in a metal etching process.
Figure 2D:
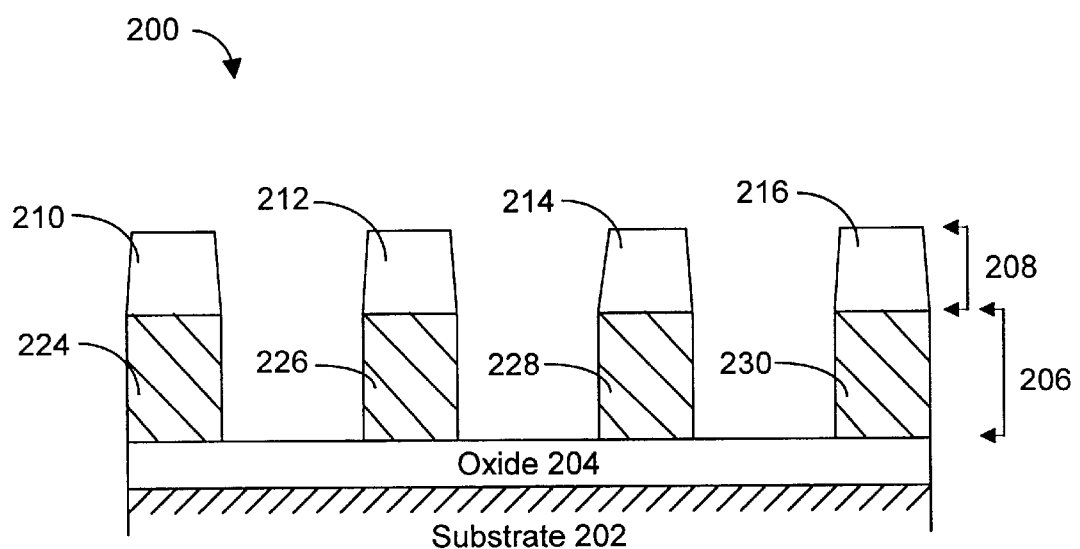
FIG. 2D illustrates the cross section of the silicon wafer stack after exposed portions of the metallization layer have been etched.

FIG. 2D illustrates the cross section of the silicon wafer stack 200 after the exposed portions 218, 220, and 222 of the metallization layer 206 have been etched. In contrast to the untreated photoresist layer 108 in Prior Art FIG. 1, the treated photoresist layer portions 210, 212, 214, and 216 exhibit little faceting. Specifically, while the untreated photoresist layer portions 118, 120, 122, and 124 of Prior Art FIG. 1 universally exhibited severe faceting, the treated photoresist layer portions 210, 212, 214, and 216 of FIG. 2D remain substantially intact. That is, the treated photoresist layer portions 210, 212, 214, and 216 have not been etched substantially. In particular, the top of the photoresist layer portions 210, 212, 214, and 216 remains almost as wide as the base. Furthermore, the largely unetched photoresist layer portions 210, 212, 214, and 216 have protected metallization layer portions 224, 226, 228, and 230, respectively, so that no mask failure is exhibited in the respective metallization layer portions 224, 226, 228, and 230.

Figure 3A:
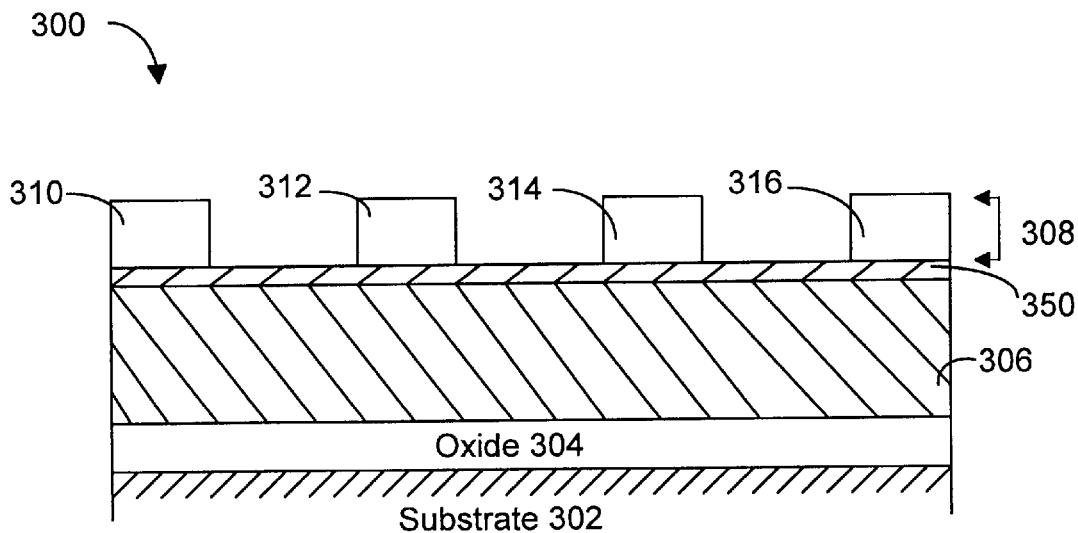
FIGS. 3A–3D illustrate a cross section of a silicon wafer stack including a dielectric layer formed between a metallization and photoresist layers.

In accordance with another embodiment of the present invention, FIG. 3A illustrates a cross-sectional view of the wafer stack 300 that includes an optional dielectric layer 350. The wafer stack 300 is substantially the same as the wafer stack 200 of FIG. 2A except that the wafer stack includes the dielectric layer 350 formed between the photoresist layer 308 (i.e., photomask) and the metallization layer 306. The dielectric layer 350 functions as an anti-reflective coating and comprises anti-reflective materials such as SiON, SiO$_2$, SiN, and the like. In particular, the dielectric layer 350 helps to prevent light, for example in a lithography process, from being reflected and scattered off the surface of the raised portions of the metallization layer 306 under the photoresist layer 308.

Figure 3B:
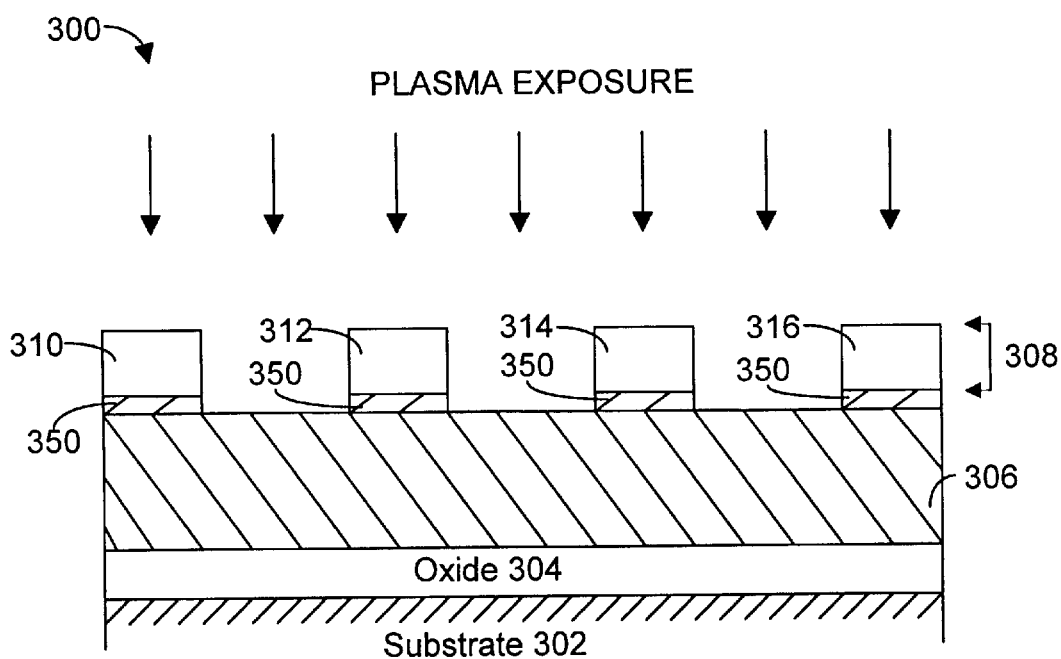

In FIG. 3B, the surface of the photoresist layer 308 is exposed to fluorocarbon- or fluorine-based plasma such as CF$_4$, CHF$_3$, C$_2$F$_6$, etc., fluorine-based plasma such as SF$_6$ plasma, or carbon-based plasma. The ions of the plasma bombard the surface of the photoresist layer 308 and harden the photoresist layer portions 310, 312, 314, and 316 against subsequent metal etchants. That is, the ion bombardment increases the resistance of the photoresist layer 308 against metal etching plasma. In a preferred embodiment, the plasma exposure also etches the unmasked or exposed portions of the dielectric layer 350 during the exposure of the photoresist layer.

Figure 3C:
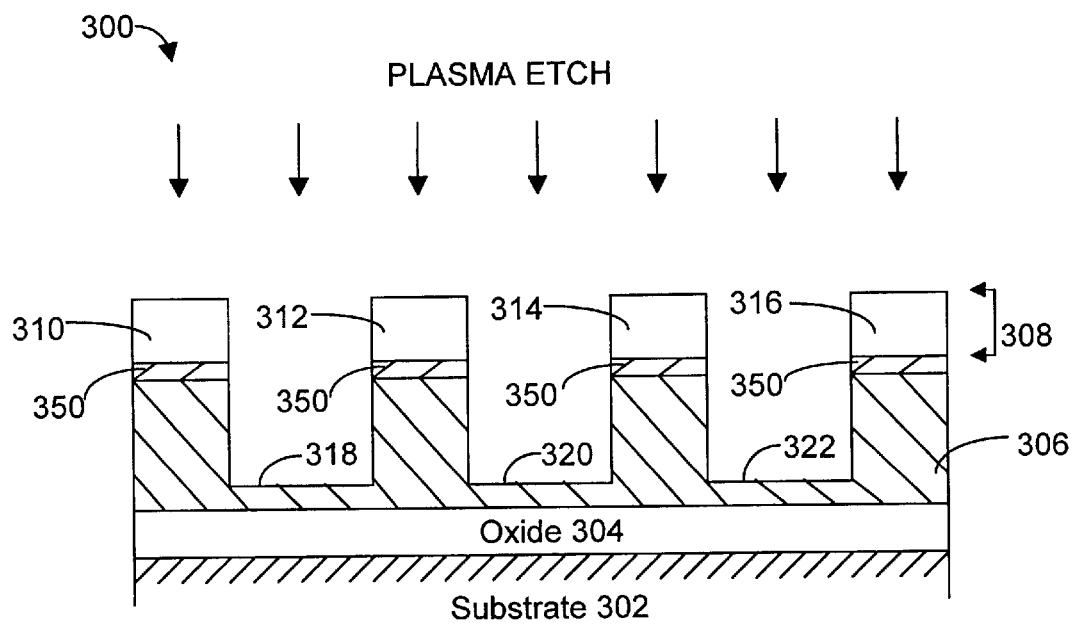

After the exposure treatment, the wafer stack 300 undergoes etching of the metallization layer 306 in FIG. 3C. The plasma etch process proceeds until the unmasked (i.e., exposed) portions 318, 320, and 322 have been etched to a desired degree. Preferably, the etch process proceeds until the unmasked metallization portions 318, 320, and 322 of the metallization layer 306 have been completely etched.

Figure 3D:
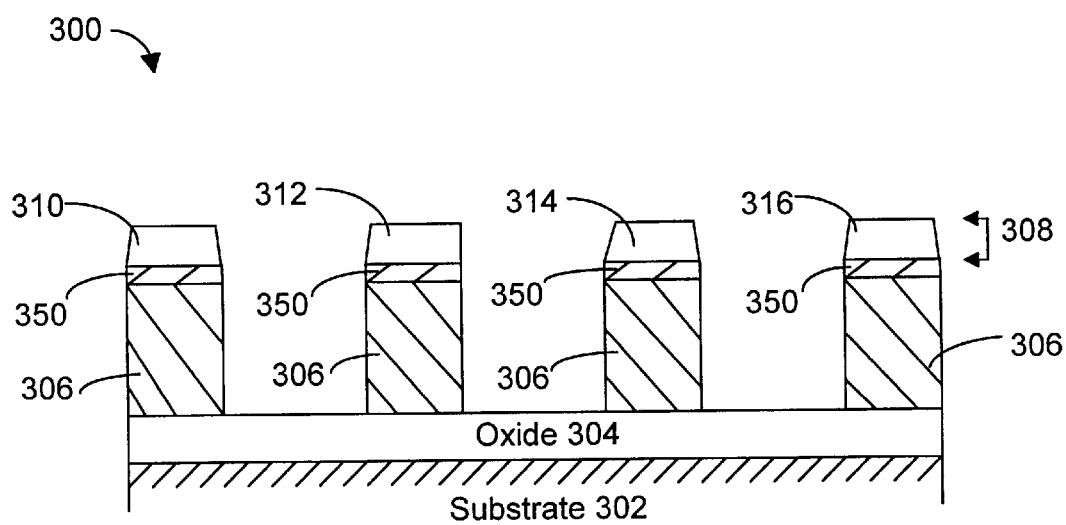

FIG. 3D illustrates a cross sectional view of the wafer stack 300 after etching the unmasked metallization layer portions 318, 320, and 322. As shown, the photoresist layer portions 310, 312, 314, and 316 remain largely intact without substantial faceting. In addition, the dielectric layer 350 and the metallization layer 306 do not exhibit etch mask failures. Accordingly, the reliability of the wafer stack 300 is increased for subsequent process steps.

Figure 4:
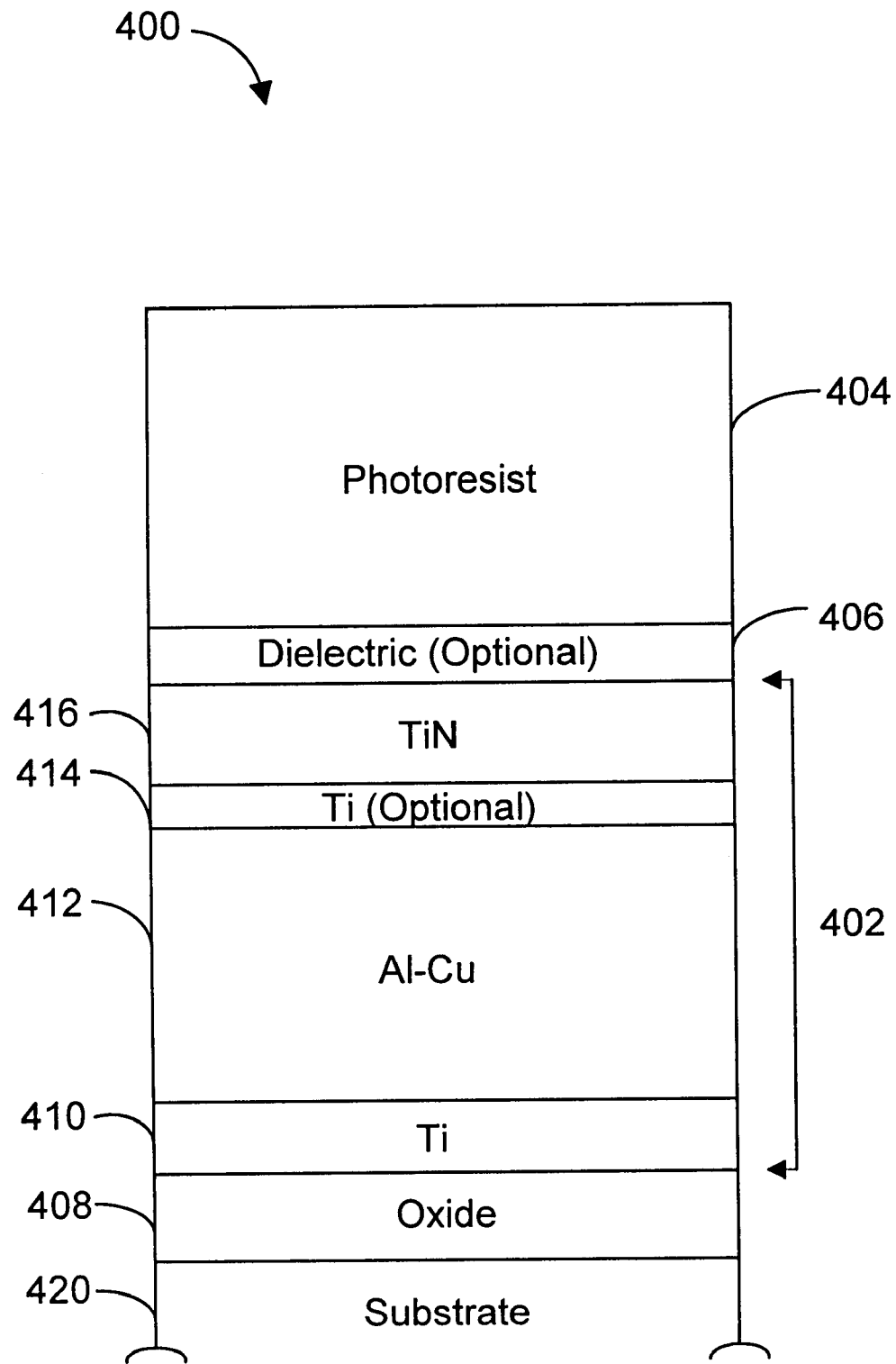
FIG. 4 illustrates a wafer stack that includes a metal stack, which may be employed as a metallization layer in accordance with one embodiment of the present invention.

In accordance with one embodiment, FIG. 4 illustrates a wafer stack 400 that includes a metal stack 402, which may be employed as the metallization layer 206 or 306. The wafer stack 400 includes an oxide layer 408 formed on a substrate 420. In one embodiment, the oxide layer 408 is an inter-metal oxide layer.

The metal stack 402 is formed over the oxide layer 408. The metal stack includes a Ti layer 410 formed over the oxide layer 408. The preferred thickness of the Ti layer 410 is about 200 angstroms. An aluminum-copper (Al—Cu) alloy layer 412 is formed over the Ti layer 410 and ranges in thickness of between 5000 to 7000 angstroms. The Al—Cu alloy layer 412 preferably includes mostly aluminum with minor amount of copper (e.g., 0.5%). An optional Ti layer 414 is formed over the Al—Cu alloy layer 412 and is about 100 angstroms thick. A TiN layer 416 is formed over the Ti layer 414 or the Al—Cu layer 412 and has a thickness of about 300 angstroms.

With continuing reference to FIG. 4, an optional dielectric layer 406 is formed on the metal stack 402. As mentioned above, the dielectric layer 406 functions as an anti-reflective coating. A photoresist layer 404 is formed over the dielectric layer 406. The layers of the wafer stack 400 may be formed using any number of suitable and known deposition processes, including chemical vapor deposition (CVD), plasma-enhanced chemical vapor deposition (PECVD), and physical vapor deposition (PVD) such as sputtering.

Figure 5:
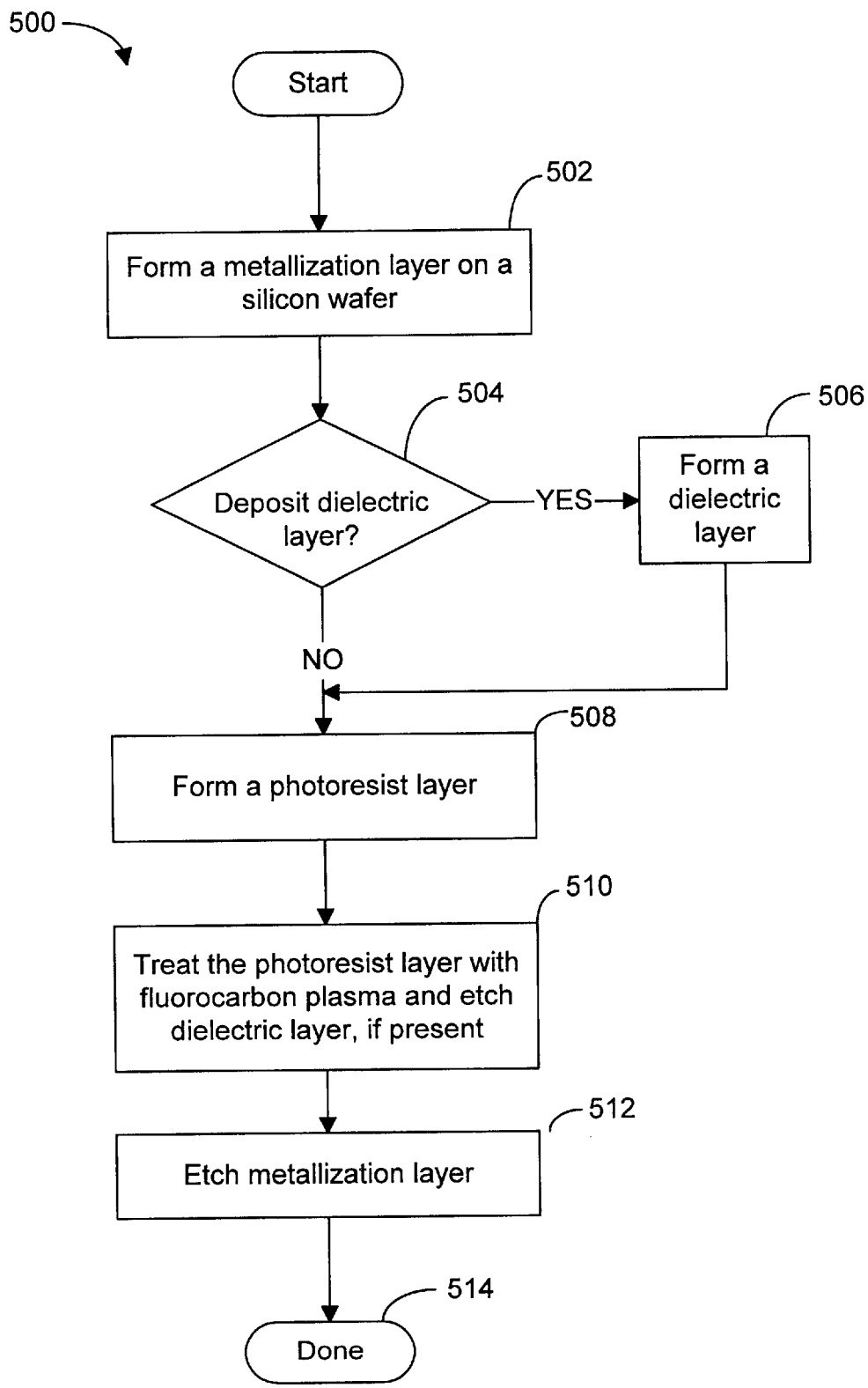
FIG. 5 illustrates a flow diagram of a method for reducing photoresist faceting during a metal etch process in accordance with one embodiment of the present invention.

FIG. 5 illustrates a flow diagram of a method 500 for reducing photoresist faceting during a metal etch process in accordance with one embodiment of the present invention. In step 502, the method 500 forms a metallization layer on a silicon substrate (e.g., wafer) or a oxide layer formed on the substrate. The metallization layer preferably includes Al, Cu, or Al—Cu alloy. The metallization layer can be deposited through any suitable deposition processes such as CVD, PECVD, PVD, and sputter deposition. In an alternative embodiment, a metal stack containing two or more layers may be employed as the metallization layer. For example, the metal stack may include Ti and TiN layers in addition to the Al, Cu, or Al—Cu alloy layer.

Step 504 determines whether a dielectric layer is to be deposited on the metallization layer. If the dielectric layer is to be deposited, the method 500 proceeds to step 506, where a dielectric layer is formed over the metallization layer. The dielectric layer may be formed by any suitable deposition process such as PECVD, CVD, PVD, and sputter deposition. The preferred embodiment utilizes a PECVD process to deposit a dielectric layer of SiON, SiO$_2$, or SiN. The thickness of SiON layer ranges between about 0 to 2000 angstroms and the thickness of SiO$_2$ ranges, when used, between about 500 and 2000 angstroms. The deposited dielectric layer may also be etched to form a desired pattern.

If no dielectric layer is to be deposited in step 304 or after depositing the dielectric layer in step 506, the method 500 forms a photoresist layer (e.g., photomask) over the metallization layer or the dielectric layer, if present. The photoresist layer may be formed on the metallization layer or the dielectric layer through well known spin-coating, exposure, and developing processes. The photoresist material of the photoresist layer may be any organic resist material such as deep UV (DUV) resist, I-line resist, and the like. These resists may be used in forming the photoresist layer through lithographic processes that use DUV wavelengths (e.g., 248 nm, 193 nm, etc.) or I-line wavelengths (e.g., 365 nm). Using a smaller or narrower wavelength allows smaller or narrower patterns to be made.

In one embodiment, the method 500 forms a UV5™ resist layer of 0.7 micron using the DUV process. The UV5™ is a UV resist material manufactured by Shipley™. In another embodiment, the method 500 forms a OiR-620™ layer of 0.88 micron using the I-line process. The OiR-620™ is an I-line resist material manufactured by Olin™. Even though the present invention utilizes DUV and I-line resist, it should be appreciated that it may also employ other suitable photoresist material and lithographic processes for forming the photoresist layer over the dielectric or the metallization layer.

After a photoresist layer has been formed, the method 500 in step 510 treats the photoresist layer by exposing the photoresist layer to, preferably, a fluorocarbon plasma such as $CF_4$, $CHF_3$, $C_2F_6$. In addition, if a dielectric layer has been formed in step 506, the dielectric layer is also etched in step 510. Although a fluorocarbon plasma is preferred, the photoresist layer may also be treated with a fluorine- or carbon-based plasma (e.g., $SF_6$). The exposure treatment may be carried out using suitable plasma etching processes or deposition processes such as PECVD, CVD, PVD, sputter deposition. In the case where the photoresist layer is formed over the dielectric layer, the exposure treatment of step 510 may also be used to etch the dielectric layer.

As an example, the treating of the photoresist layer may employ a plasma etching apparatus such as Lam 4520™ plasma etch tool, which is manufactured by Lam Research of Fremont, Calif. Exemplary process parameters using the Lam 4520™ on 650 angstrom SiON dielectric layer over metallization layer with 0.7 micron DUV resist are: 10 degree Celcius lower electrode temperature, 200 mT chamber pressure, 700 Watt power, 1.25 cm electrode gap, 200 sccm Ar, 60 sccm $CF_4$, 11 Torr helium cooling pressure, and 12 second $CF_4$ plasma exposure. It should be noted that these parameters are exemplary only, and that the parameters may vary in accordance with other variables such as the thickness and type of the layers. In addition, the exposure time may vary depending on such variables as type, volume, pressure, and flow rate of gases, exposure process, power, etc.

The treatment in step 510 increases the resistance of the photoresist layer to metal etch plasma, which may subsequently be used to etch the metallization layer. For example, the exposure to a fluorocarbon plasma hardens the photoresist layer. The hardened photoresist layer inhibits bombarding ions which are used to etch the metallization layer through, for example, sputter etching.

After the exposure treatment in step 510, the method 500 etches the metallization layer by exposing the metallization layer along with the photoresist layer to a metal etch plasma. The etch plasma may include metal etchants such as $BCl_3$, $Cl_2$, $CCl_4$, HCl, $SiCl_4$, and the like. The metal etchants are bombarded at the metallization layer using plasma etching methods such as sputter etching, reactive-ion etching, and the like. The metal etching process may employ a plasma etching apparatus such as Lam 9600SE™, which is manufactured by Lam Research of Fremont, Calif. The method 500 then terminates in step 514.

Advantageously, the present invention increases the resistance of a photoresist layer against metal etch plasma. The increased etch resistance of the photoresist layer substantially withstands bombarding plasma ions designed to etch a metallization layer. Accordingly, the formation of facets on the patterned photoresist layer is significantly reduced.

While the present invention has been described in terms of several preferred embodiments, there are alterations, permutations, and equivalents which fall within the scope of this invention. It should also be noted that there are alternative ways of implementing both the method, device, and system of the present invention. It is therefore intended that the following appended claims be interpreted as including all such alterations, permutations, and equivalents as fall within the true spirit and scope of the present invention.

What is claimed is:

1. A method for reducing faceting of a photoresist layer during an etch process, the method comprising:

a) depositing a metallization layer on a semiconductor substrate;

b) forming a photoresist layer over at least a portion of the metallization layer;

c) treating the photoresist layer with a first plasma so as to harden the photoresist layer against a metal etching plasma that is different from the first plasma; and d) exposing the metallization layer and the photoresist layer to the metal etching plasma, the metal etching plasma etching the metallization layer at a substantially faster rate than the treated photoresist layer such that the photoresist layer remains substantially intact from faceting effects.

2. The method as recited in claim 1, wherein the metal etching plasma is selected from the plasma group consisting essentially of $BCl_3$, $Cl_2$, $CCl_4$, HCl, and $SiCl_4$.

3. The method as recited in claim 1, wherein the first plasma is a fluorocarbon-based plasma.

4. The method as recited in claim 3, wherein the fluorocarbon plasma is selected from the plasma group consisting essentially of $CF_4$, $CHF_3$, and $C_2F_6$.

5. The method as recited in claim 1, wherein the first plasma is a fluorine-based plasma.

6. The method as recited in claim 5, wherein the fluorine-based plasma is a $SF_6$ plasma.

7. The method as recited in claim 1, wherein the first plasma is a carbon-based plasma.

8. The method as recited in claim 1, further comprising:

forming a dielectric layer over the metallization layer and under the photoresist layer.

9. The method as recited in claim 8, wherein the dielectric layer forming further comprises:

depositing a dielectric layer; and etching the dielectric layer.

10. The method as recited in claim 9, wherein the dielectric layer is etched during the photoresist layer treating operation c).

11. The method as recited in claim 9, wherein the dielectric layer is an anti-reflective coating layer.

12. The method as recited in claim 1, wherein the metallization layer and the photoresist layer are exposed to the metal etching plasma in a plasma etching process.

13. The method as recited in claim 1, wherein the hardened photoresist layer inhibits the metal etching plasma from substantially etching the photoresist layer and the portion of metallization layer under the photoresist layer.

14. The method as recited in claim 1, wherein the treating of the photoresist layer substantially reduces sensitivity of the photoresist layer to the metal etching plasma.

15. The method as recited in claim 1, wherein the metallization layer comprises a metal stack including a plurality of metal layers.

16. The method as recited in claim 1, wherein the photoresist layer forming further comprises:

spin coating a photoresist material over the metallization layer;

exposing the coated photoresist material under a light source to a desired pattern; and developing the coated photoresist material to produce the photoresist layer adapted to function as a photomask.

17. A method for reducing faceting of a photoresist layer during an etch process, the method comprising:

a) depositing a first layer on a semiconductor substrate;

b) forming a photoresist layer over at least a portion of the first layer;

c) treating the photoresist layer with a first plasma so as to harden the photoresist layer against an etching plasma that is adapted to etch the first layer, wherein the etching plasma is different from the first plasma; and d) exposing the first layer and the photoresist layer to the etching plasma, the etching plasma etching the first layer at a substantially faster rate than the treated photoresist layer such that the photoresist layer remains substantially intact from faceting effects.

18. The method as recited in claim 17, wherein the etching plasma is selected from the plasma group consisting essentially of $BCl_3$, $Cl_2$, $CCl_4$, HCl, and $SiCl_4$.

19. The method as recited in claim 17, wherein the first plasma is a fluorocarbon-based plasma.

20. The method as recited in claim 19, wherein the fluorocarbon plasma is selected from the plasma group consisting essentially of $CF_4$, $CHF_3$, and $C_2F_6$.

21. The method as recited in claim 17, wherein the first plasma is a fluorine-based plasma.

22. The method as recited in claim 17, wherein the first plasma is a carbon-based plasma.

23. The method as recited in claim 21, wherein the fluorine-based plasma is a $SF_6$ plasma.

24. The method as recited in claim 17, further comprising:

forming a dielectric layer over the first layer and under the photoresist layer.

25. The method as recited in claim 17, wherein the first layer and the photoresist layer are both exposed to the etching plasma in a plasma etching process.

26. The method as recited in claim 17, wherein the hardened photoresist layer inhibits the etching plasma from substantially etching the photoresist layer and the portion of first layer disposed under the photoresist layer.

27. The method as recited in claim 17, wherein the treating of the photoresist layer substantially reduces sensitivity of the photoresist layer to the etching plasma.

28. The method as recited in claim 17, wherein the first layer is a metallization layer.

29. The method as recited in claim 17, wherein the first layer is a metal stack including a plurality of metal layers.

30. The method as recited in claim 17, wherein the photoresist layer forming further comprises:

spin coating a photoresist material over the first layer;

exposing the coated photoresist material under a light source to a desired pattern; and developing the coated photoresist material to produce the photoresist layer adapted to function as a photomask.

31. A method for reducing faceting of a photoresist layer during an etch process, the method comprising:

a) depositing a metallization layer on a semiconductor substrate;

b) forming a photoresist layer over at least a portion of the metallization layer;

c) treating the photoresist layer with a fluorocarbon plasma so as to harden the photoresist layer against a metal etching plasma that is different from the fluorocarbon plasma; and d) exposing the metallization layer and the photoresist layer to the metal etching plasma, the metal etching plasma etching the metallization layer at a substantially faster rate than the treated photoresist layer such that the photoresist layer remains substantially intact from faceting effects.

32. The method as recited in claim 31, wherein the metal etching plasma is selected from the plasma group consisting essentially of $BCl_3$, $Cl_2$, $CCl_4$, HCl, and $SiCl_4$.

33. The method as recited in claim 31, wherein the fluorocarbon plasma is selected from the plasma group consisting essentially of $CF_4$, $CHF_3$, and $C_2F_6$.

34. The method as recited in claim 31, further comprising:

forming a dielectric layer over the metallization layer and under the photoresist layer.

35. The method as recited in claim 34, wherein the dielectric layer forming further comprises:

depositing a dielectric layer; and etching the dielectric layer.

36. The method as recited in claim 35, wherein the dielectric layer is etched while the photoresist layer is being treated.

37. The method as recited in claim 34, wherein the dielectric layer is an anti-reflective coating layer.

38. The method as recited in claim 31, wherein the metallization layer and the photoresist layer are exposed to the metal etching plasma in a plasma etching process.

39. The method as recited in claim 31, wherein the hardened photoresist layer inhibits the metal etching plasma from substantially etching the photoresist layer and the portion of metallization layer under the photoresist layer.

40. The method as recited in claim 31, wherein the treating of the photoresist layer substantially reduces sensitivity of the photoresist layer to the metal etching plasma.

41. The method as recited in claim 31, wherein the metallization layer comprises a metal stack including a plurality of metal layers.

42. The method as recited in claim 31, wherein the photoresist layer forming further comprises:

spin coating a photoresist material over the metallization layer;

exposing the coated photoresist material under a light source to a desired pattern; and developing the coated photoresist material to produce the photoresist layer adapted to function as a photomask.

* * * * *